(12) United States Patent
Vogelsang

(10) Patent No.: US 7,227,799 B2
(45) Date of Patent: Jun. 5, 2007

(54) SENSE AMPLIFIER FOR ELIMINATING LEAKAGE CURRENT DUE TO BIT LINE SHORTS

(75) Inventor: Thomas Vogelsang, Jericho, VT (US)

(73) Assignee: Infineon Technologies AG, Munich (DE)

( * ) Notice: Subject to any disclaimer, the term of this patent is extended or adjusted under 35 U.S.C. 154(b) by 48 days.

(21) Appl. No.: 11/118,036

(22) Filed: Apr. 29, 2005

(65) Prior Publication Data
US 2006/0245283 A1 Nov. 2, 2006

(51) Int. Cl.
G11C 7/00 (2006.01)

(52) U.S. Cl. .................. 365/205; 365/207; 365/208

(58) Field of Classification Search ................ 365/205, 365/207, 208, 226, 227
See application file for complete search history.

(56) References Cited

U.S. PATENT DOCUMENTS

| | | | |
|---|---|---|---|
| 5,673,219 A | 9/1997 | Hashimoto | |
| 5,896,334 A | 4/1999 | Casper et al. | |
| 5,982,688 A * | 11/1999 | Han | 365/207 |
| 6,041,003 A | 3/2000 | Casper et al. | |
| 6,118,728 A | 9/2000 | Casper et al. | |
| 6,154,401 A | 11/2000 | Casper et al. | |
| 6,181,618 B1 * | 1/2001 | Inaba et al. | 365/207 |
| 6,205,071 B1 * | 3/2001 | Ooishi | 365/207 |
| 6,285,612 B1 * | 9/2001 | DeBrosse | 365/205 |
| 6,337,821 B1 * | 1/2002 | Watanabe et al. | 365/205 |
| 6,850,454 B2 | 2/2005 | Kuge et al. | |
| 6,977,856 B2 * | 12/2005 | Tanaka et al. | 365/205 |
| 7,102,954 B2 * | 9/2006 | Noda et al. | 365/207 |
| 2004/0178830 A1 | 9/2004 | Brox | |

* cited by examiner

Primary Examiner—Phan Trong
(74) Attorney, Agent, or Firm—Dicke, Billig & Czaja, PLLC

(57) ABSTRACT

A sense amplifier comprises a transistor configured to be switched with a column select line to pass a bit line equalization voltage, an array equalize device coupled to the transistor for receiving the bit line equalization voltage, a sense amplifier equalize device, a multiplexer coupled between the sense amplifier equalize device and the array equalize device, and a cross-coupled amplifier latch coupled to the sense amplifier equalize device.

15 Claims, 9 Drawing Sheets

| | precharge | active | read / write |
|---|---|---|---|
| BNKSEL | GND | VPP | VPP |
| CSL (good column) | GND | GND | VINT |
| CSL (bad column) | VINT | GND | GND |
| BL at good column inside SA | VBLEQ | 0 or VBLH | 0 or VBLH |
| BL at good column in array on active side | VBLEQ | 0 or VBLH | 0 or VBLH |
| BL at good column in array on inactive side | VBLEQ | VBLEQ | VBLEQ |
| BL at bad column inside SA | VBLEQ | 0 or VBLH | 0 or VBLH |
| BL at bad column in array with short on active side | GND (through short to WL) | 0 or VBLH | 0 or VBLH |
| BL at bad column in array with short on inactive side | GND (through short to WL) | VBLEQ with short to VNWLL | VBLEQ with short to VNWLL |
| BL at bad column in array without short on active side | floating | 0 or VBLH | 0 or VBLH |
| BL at bad column in array without short on inactive side | floating | VBLEQ | VBLEQ |
| MUX on active side (here MUXl) | GND | VPP | VPP |
| MUX on inactive side (here MUXr) | GND | GND | GND |
| EQL on active side (here EQLl) | VEQL | GND | GND |
| EQL on inactive side (here EQLr) | VEQL | VEQL | VEQL |
| EQLSA | VEQL | GND | GND |
| Active MWL | VPP | VNWLL | VNWLL |
| Inactive MWL without short | VPP | VPP | VPP |
| Inactive MWL with short | VNWLL | VPP | VPP |
| Active WLDV | GND | VPP | VPP |
| Inactive WLDV | GND | GND | GND |
| Active WLRST | GND | GND | GND |
| Inactive WLRSTs | GND | VINT | VINT |
| Active WL without short | VNWLL | VPP | VPP |
| Inactive WL without short | VNWLL | VNWLL | VNWLL |
| Inactive WL with short | GND | VNWLL | VNWLL |

Fig. 12

SENSE AMPLIFIER FOR ELIMINATING LEAKAGE CURRENT DUE TO BIT LINE SHORTS

BACKGROUND

Many mobile devices require dynamic random access memories (DRAMs) with extremely low standby power specifications to conserve battery power. One type of DRAM designed for mobile devices is CellularRAM™, which has a specified standby current of about 100 µA. The suppression of leakage current is typically more difficult in CellularRAMs than in standard DRAMs since even a small leakage current has a large contribution to the overall current in a CellularRAM. Specifically, shorts in a memory array that pull the bit lines to ground or to the negative word line low voltage level create a leakage path through the bit line equalize devices to the bit line equalization voltage, which is half of the bit line voltage in the case of a standard midlevel sense amplifier.

In standard DRAM sense amplifier designs, a device is added that increases the resistance between the bit line and the bit line equalization voltage and limits the current. Typically, the device that provides the additional resistance is a long channel transistor or a depletion transistor. Typical DRAMs limit the leakage current using the additional resistance to a value between 10 µA and 50 µA per short. While this level of leakage current is satisfactory for a standard DRAM with a standby current specification of a few milliamps, this level of leakage current is not sufficient for extreme low power DRAMs, such as CellularRAM. Increasing the resistance of this device to further reduce the leakage current has two significant disadvantages. The first disadvantage includes greatly increasing the sense amplifier area, and the second disadvantage includes possible insufficient equalization of all bit lines.

SUMMARY

One embodiment of the present invention provides a sense amplifier for a memory. The sense amplifier comprises a transistor configured to be switched with a column select line to pass a bit line equalization voltage, an array equalize device coupled to the transistor for receiving the bit line equalization voltage, a sense amplifier equalize device, a multiplexer coupled between the sense amplifier equalize device and the array equalize device, and a cross-coupled amplifier latch coupled to the sense amplifier equalize device.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIG. 12 is a table illustrating one embodiment of the states of signals during a precharge, active, and read/write state of the random access memory.

DETAILED DESCRIPTION

Figure 1:
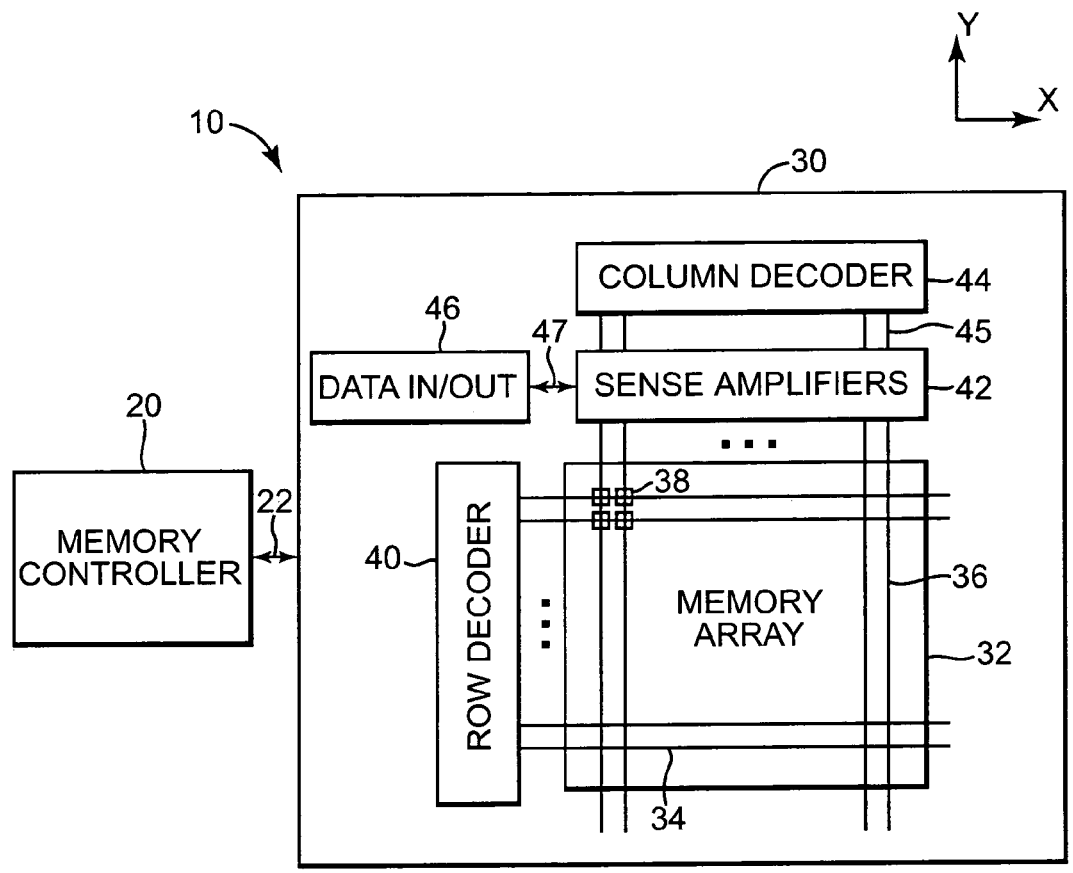
FIG. 1 is a block diagram illustrating one embodiment of a random access memory, according to the present invention.

FIG. 1 is a block diagram illustrating one embodiment of a random access memory 10. In one embodiment, random access memory 10 is a Dynamic Random Access Memory (DRAM). DRAM 10 includes a memory controller 20 and at least one memory bank 30. Memory bank 30 includes an array of memory cells 32, a row decoder 40, a column decoder 44, sense amplifiers 42, and data in/out circuit 46. Memory controller 20 is electrically coupled to memory bank 30 through communication link 22.

DRAM 10 is configured to switch off equalization individually for bit lines that have memory array shorts while not affecting equalization of other bit lines. The bit lines that have memory array shorts are replaced by redundant bit lines. The failing bit lines have no leakage current due to the memory array shorts. Equalization of the remaining bit lines is not affected. The device count in the sense amplifier is not increased, there are no horizontal wires added to the memory array, and only one vertical wire is added to each sense amplifier. Therefore, the increased circuit area used to implement the present invention is minimal. DRAM 10 is configured to switch the equalize devices using the column select lines (CSLs).

Conductive word lines 34, referred to as row select lines, extend in the x-direction across the array of memory cells 32. Conductive bit lines pairs 36 extend in the y-direction across the array of memory cells 32. A memory cell 38 is located at each cross point of a word line 34 and a bit line pair 36. Each word line 34 is electrically coupled to row decoder 40, and each bit line pair 36 is electrically coupled to a sense amplifier 42. The sense amplifiers 42 are electrically coupled to column decoder 44 through conductive column decoder lines 45 and to data in/out circuit 46 through data lines 47.

Data in/out circuit 46 includes a plurality of latches and data input/output (I/O) pads or pins (DQs) to transfer data between memory bank 30 and an external device. Data to be written into memory bank 30 is presented as voltages on the DQs from an external device. The voltages are translated into the appropriate signals and stored in selected memory cells 38. Data read from memory bank 30 is presented by memory bank 30 on the DQs for an external device to retrieve. Data read from selected memory cells 38 appears at the DQs once access is complete and the output is enabled. At other times, the DQs are in a high impedance state.

Memory controller 20 controls reading data from and writing data to memory bank 30. During a read operation, memory controller 20 passes the row address of a selected memory cell or cells 38 to row decoder 40. Row decoder 40 activates the selected word line 34. As the selected word line 34 is activated, the value stored in each memory cell 38 coupled to the selected word line 34 is passed to the respective bit line pair 36. The value of each memory cell 38 is read by a sense amplifier 42 electrically coupled to the respective bit line pair 36. Memory controller 20 passes a column address of the selected memory cell or cells 38 to column decoder 44. Column decoder 44 selects which sense amplifiers 42 pass data to data in/out circuit 46 for retrieval by an external device.

During a write operation, the data to be stored in array 32 is placed in data in/out circuit 46 by an external device. Memory controller 20 passes the row address for the selected memory cell or cells 38 where the data is to be stored to row decoder 40. Row decoder 40 activates the selected word line 34. Memory controller 20 passes the column address for the selected memory cell or cells 38 where the data is to be stored to column decoder 44. Column decoder 44 selects which sense amplifiers 42 are passed the data from data in/out circuit 46. Sense amplifiers 42 write the data to the selected memory cell or cells 38 through bit line pairs 36.

Figure 2:
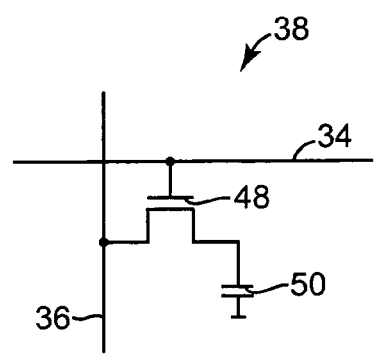
FIG. 2 is a diagram illustrating one embodiment of a memory cell.

FIG. 2 is a diagram illustrating one embodiment of one memory cell 38 in the array of memory cells 32. Memory cell 38 includes a transistor 48 and a capacitor 50. The gate of transistor 48 is electrically coupled to word line 34. The drain-source path of transistor 48 is electrically coupled to one bit line of bit line pair 36 and capacitor 50. Capacitor 50 is charged to represent either a logic "0" or a logic "1". During a read operation, word line 34 is activated to turn on transistor 48 and the value stored on capacitor 50 is read by a corresponding sense amplifier 42 through the one bit line of bit line pair 36 and transistor 48. During a write operation, word line 34 is activated to turn on transistor 48 and the value stored on capacitor 50 is written by a corresponding sense amplifier 42 through the one bit line of bit line pair 36 and transistor 48.

The read operation on memory cell 38 is a destructive read operation. After each read operation, capacitor 50 is recharged with the value that was just read. In addition, even without read operations, the charge on capacitor 50 discharges over time. To retain a stored value, memory cell 38 is refreshed periodically by reading or writing the memory cell 38. All memory cells 38 within the array of memory cells 32 are periodically refreshed to maintain their values.

In one embodiment, random access memory 10 is a Double Data Rate Synchronous Dynamic Random Access Memory (DDR SDRAM), DDR-II SDRAM, or DDR-III SDRAM. In another embodiment, random access memory 10 is a Pseudo Static Random Access Memory (PSRAM). One type of PSRAM is CellularRAM™, which is adapted for wireless applications. CellularRAM is a drop-in replacement for Static Random Access Memory (SRAM) and is based on a single transistor DRAM cell versus a six transistor SRAM cell. In another embodiment, random access memory 10 is a low power SDRAM, which is also known as mobile random access memory (Mobile-RAM). Mobile-RAM is a low power synchronous DRAM designed especially for mobile applications, such as cellular telephones, personal digital assistants (PDAs), handheld computers, etc.

In one embodiment, DRAMs use a number of voltages to operate including a supply voltage (VDD or VINT), a common voltage (VSS), a bit line high voltage (VBLH), a boosted word line voltage (VPP), an array transistor back bias voltage (VBB), an array plate voltage (VPL), a bit line equalization voltage in standby mode (VBLEQ), a negative word line low voltage (VNWLL), and an equalization voltage (VEQL). VBLH is the voltage applied to a bit line pair 36 for setting a memory cell to a logic "1". VPP is the voltage applied to a word line 34 for setting a memory cell to a logic "1". VPP is greater than VBLH plus an array device threshold voltage (VTarray) to write VBLH into a memory cell. VBB is used to suppress subthreshold leakage of the array device and the vertical parasitic trench transistor. VBB also provides fine tuning of the array device threshold voltage and decreases bit line capacitance. VPL is equal to VBLH/2. VPL reduces node dielectric stress and provides a symmetric cell capacitance for a logic "1" and a logic "0". VBLEQ equals VBLH/2. VBLEQ provides a reference voltage for the sense amplifiers in standby mode. VNWLL reduces the array device subthreshold leakage. VEQL is the voltage applied to the gates of array equalize devices and sense amplifier equalize devices to turn on the equalize devices.

Figure 3:
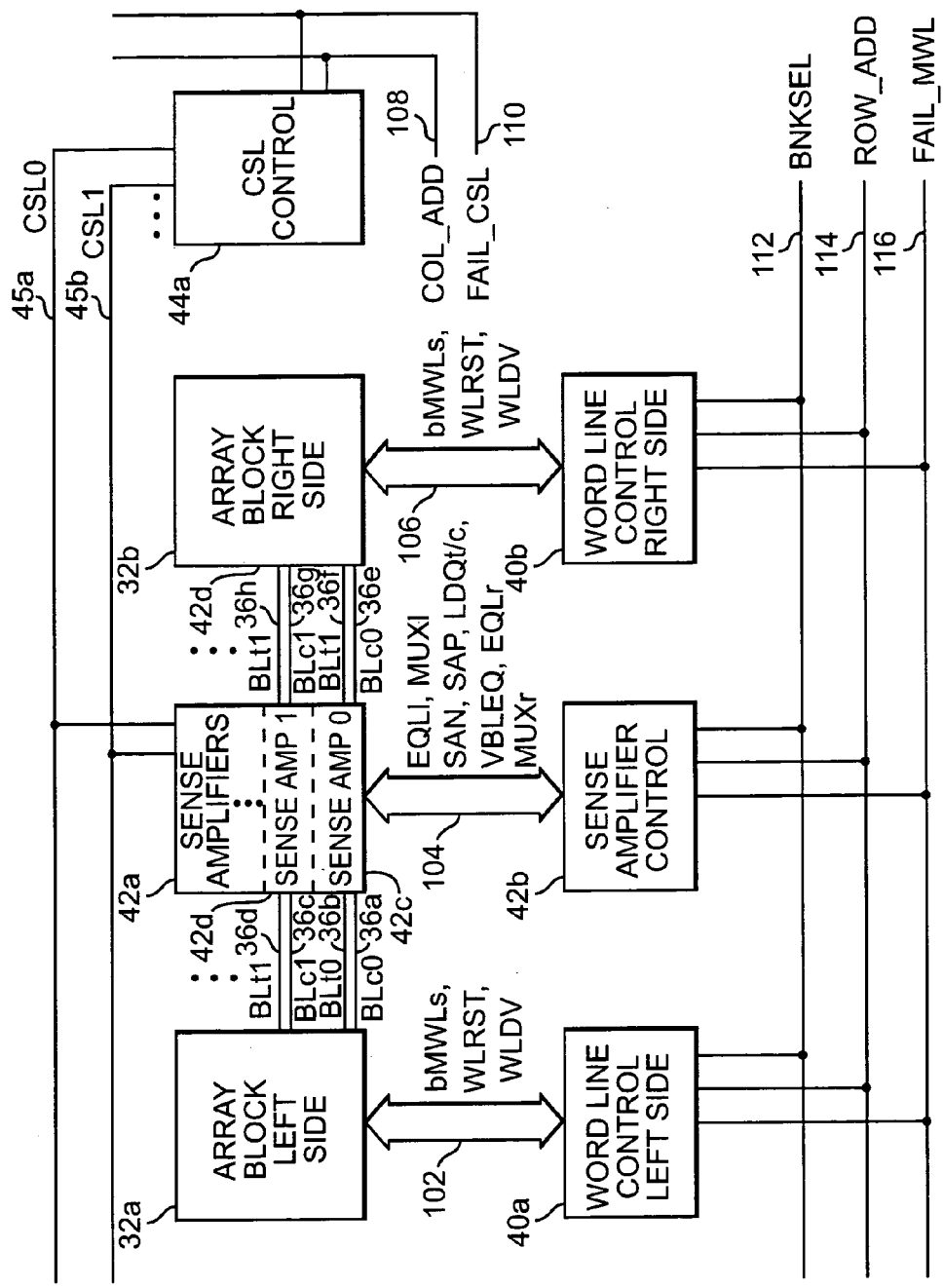
FIG. 3 is a block diagram illustrating one embodiment of a portion of a dynamic random access memory.

FIG. 3 is a block diagram illustrating one embodiment of a portion of DRAM 10. The portion of DRAM 10 includes memory array block left side 32*a*, sense amplifiers 42*a*, memory array block right side 32*b*, column select line (CSL) control circuit 44*a*, word line control left side circuit 40*a*, sense amplifier control circuit 42*b*, and word line control right side circuit 40*b*. In one embodiment, memory array block left side 32*a* includes a block of memory cells 38 on the left side of memory array 32, and memory array block right side 32*b* includes a block of memory cells 38 on the right side of memory array 32. In one embodiment, sense amplifiers 42*a* includes sense amplifiers zero 42*c*, one 42*d*, etc. located between and shared by memory array block left side 32*a* and memory array block right side 32*b* for reading data from or writing data to memory cells 38. In one embodiment, word line control left side circuit 40*a* and word line control right side circuit 40*b* are part of row decoder 40. In one embodiment, CSL control circuit 44*a* is part of column decoder 44.

CSL control circuit 44*a* receives the column address (COL_ADD) signal on COL_ADD signal path 108 and the fail column select line address (FAIL_CSL) signal on FAIL_CSL signal path 110. CSL control circuit 44*a* is electrically coupled to sense amplifiers 42*a* through column select line zero (CSL0) signal path 45*a*, column select line one (CSL1) signal path 45*b*, and other column select lines (not shown). Memory array block left side 32*a* is electrically coupled to sense amplifier zero 42*c* through bit line complement zero (BLc0) signal path 36*a* and bit line true zero (BLt0) signal path 36*b*. Memory array block left side 32*a* is electrically coupled to sense amplifier one 42*d* through BLc1 signal path 36*c* and BLt1 signal path 36*d*. Memory array block left side 32*a* is also electrically coupled to other sense amplifiers 42*a* through other BLc and BLt signal paths (not shown). Memory array right side 32*b* is electrically coupled to sense amplifier zero 42*c* through BLc0 signal path 36*e* and BLt1 signal path 36*f*. Memory array block right side 32*b* is electrically coupled to sense amplifier one 42*d* through BLc1 signal path 36*g* and BLt1 signal path 36*h*. Memory array block right side 32*b* is also electrically coupled to other sense amplifiers 42*a* through other BLc and BLt signal paths (not shown).

Array block left side 32*a* is electrically coupled to word line control left side circuit 40*a* through communication link 102. Communication link 102 includes signal paths for transmitting inverted master word line (bMWL) signals, word line reset (WLRST) signals, and word line driver (WLDV) signals. Sense amplifiers 42*a* are electrically coupled to sense amplifier control circuit 42b through communication link 104. Communication link 104 includes signal paths for transmitting equalize device left (EQL1) signals, multiplexer left (MUX1) signals, n-sense supply (SAN) signals, p-sense supply (SAP) signals, true and compliment local data line pair (LDQt/c) signals, bit line equalization voltage (VBLEQ) signals, equalize device right (EQLr) signals, and multiplexer right (MUXr) signals.

Array block right side 32b is electrically coupled to word line control right side circuit 40b through communication link 106. Communication link 106 includes signal paths for transmitting bMWL signals, WLRST signals, and WLDV signals. Word line control left side circuit 40a, sense amplifier control circuit 42b, and word line control right side circuit 40b receive the bank select (BNKSEL) signal on BNKSEL signal path 112, the row address (ROW_ADD) signal on ROW_ADD signal path 114, and the address of failed master word line (FAIL_MWL) signal on FAIL_MWL signal path 116.

Word line control left side circuit 40a receives the BNKSEL signal on BNKSEL signal path 112, the ROW_ADD signal on ROW_ADD signal path 114, and the FAIL_MWL signal on FAIL_MWL signal path 116 to provide the bMWL signals, WLRST signals, and WLDV signals to memory array block left side 32a through communication link 102. Word line control left side circuit 40a controls the row select signals and voltages in memory array block left side 32a to read data from and write data to memory array block left side 32a. In response to the FAIL_MWL signal equaling the ROW_ADD signal, the bMWL signal for the failed MWL is held to VNWLL or ground to hold the failed word line to ground through the local word line driver.

Word line control right side circuit 40b receives the BNKSEL signal on BNKSEL signal path 112, the ROW_ADD signal on ROW_ADD signal path 114, and the FAIL_MWL signal on FAIL_MWL signal path 116 to provide the bMWL signals, WLRST signals, and WLDV signals to memory array block right side 32b though communication link 106. Word line control right side circuit 40b controls the row select signals and voltages in memory array block right side 32b to read data from and write data to memory array block right side 32b. In response to the FAIL_MWL signal equaling the ROW_ADD signal, the bMWL signal for the failed MWL is held to VNWLL or ground to hold the failed word line to ground through the local word line driver.

Sense amplifier control circuit 42b receives the BNKSEL signal on BNKSEL signal path 112, the ROW_ADD signal on ROW_ADD signal path 114, and the FAIL_MWL signal on FAIL_MWL signal path 116 to provide the EQL1 signal, MUX1 signal, SAN signal, SAP signal, LDQt/c signals, VBLEQ signal, EQLr signal, and MUXr signal to sense amplifiers 42a through communication link 104. Sense amplifier control circuit 42b controls the operation of sense amplifiers 42a to read data from and write data to memory array block left side 32a and memory array block right side 32b.

Sense amplifiers 42a receive the CSL0 signal on CSL0 signal path 45a, the CSL1 signal on CSL1 signal path 45b, etc. Sense amplifier zero 42c receives data from or provides data to either memory array block left side 32b through BLc0 signal path 36a and BLt0 signal path 36b or memory array block right side 32b through BLc0 signal path 36e and BLt0 signal path 36f. Sense amplifier one 42d receives data from or provides data to either memory array block left side 32a through BLc1 signal path 36c and BLt1 signal path 36d or memory array block right side 32b through BLc1 signal path 36g and BLt1 signal path 36h.

CSL control circuit 44a receives the COL_ADD signal on COL_ADD signal path 108 and the FAIL_CSL signal on FAIL_CSL signal path 110 to provide the column select line signals (CSL0, CSL1, etc.). In response to the FAIL_CSL signal equaling the COL_ADD signal, the CSL signal for the failed CSL is modified to switch the equalize devices of sense amplifiers 42a to stop leakage current for bit lines that have memory array shorts.

Figure 4:
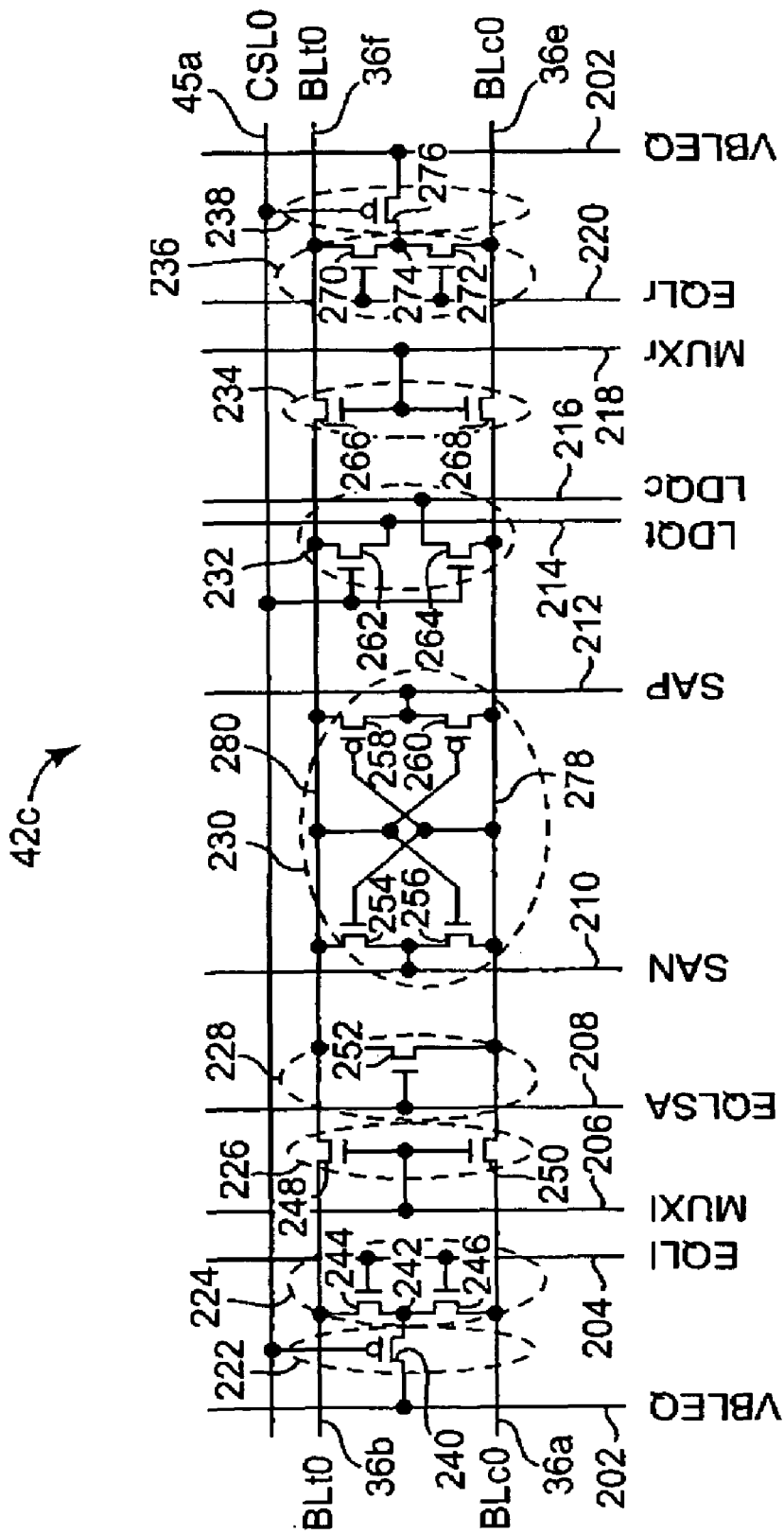
FIG. 4 is a diagram illustrating one embodiment of a midlevel sense amplifier circuit, according to the present invention.

FIG. 4 is a diagram illustrating one embodiment of midlevel sense amplifier zero 42c, according to the present invention. A similar sense amplifier is used for sense amplifiers one 42d and other sense amplifiers 42a. Sense amplifier 42c includes left and right leakage limiters 222 and 238, left and right array equalize devices 224 and 236, multiplexer 226 and 234 for an interleaved sense amplifier, sense amplifier equalize device 228, cross-coupled amplifier latch 230, and bit line to data line switch 232.

Left side leakage limiter 222 includes transistor 240, and right side leakage limiter 238 includes transistor 276. In one embodiment, transistors 240 and 276 are p-channel field effect transistors. Left side array equalize device 224 includes transistors 244 and 246, and right side equalize device 236 includes transistors 270 and 272. In one embodiment, transistors 244, 246, 270, and 272 are n-channel field effect transistors. Multiplexer 226 and 234 includes transistors 248, 250, 266, and 268. In one embodiment, transistors 248, 250, 266, and 268 are n-channel field effect transistors. Sense amplifier equalize device 228 includes transistor 252. In one embodiment, transistor 252 is an n-channel field effect transistor. Cross-coupled amplifier latch 230 includes transistors 254, 256, 258, and 260. In one embodiment, transistors 254 and 256 are n-channel field effect transistors, and transistors 258 and 260 are p-channel field effect transistors. Bit line to data line latch 232 includes transistors 262 and 264. In one embodiment, transistors 262 and 264 are n-channel field effect transistors.

The gate of transistor 240 is electrically coupled to CSL0 signal path 45a. The drain-source path of transistor 240 is electrically coupled between bit line equalization voltage (VBLEQ) signal path 202 and one side of the drain-source path of transistor 244 and one side of the drain-source path of transistor 246 through signal path 242. The other side of the drain-source path of transistor 244 is electrically coupled to BLt0 signal path 36b. The other side of the drain-source path of transistor 246 is electrically coupled to BLc0 signal path 36a. The gates of transistors 244 and 246 are electrically coupled to equalize left (EQL1) signal path 204.

The gates of transistors 248 and 250 are electrically coupled to multiplexer left (MUX1) signal path 206. The drain-source path of transistor 248 is electrically coupled between BLt0 signal path 36b and signal path 280. The drain-source of path of transistor 250 is electrically coupled between BLc0 signal path 36a and signal path 278. The gate of transistor 252 is electrically coupled to equalize sense amplifier (EQLSA) signal path 208. The drain-source path of transistor 252 is electrically coupled between signal path 280 and signal path 278.

The gates of transistors 254 and 258 are electrically coupled to signal path 278. The gates of transistors 256 and 260 are electrically coupled to signal path 280. The drain-source path of transistor 256 is electrically coupled between signal path 280 and SAN signal path 210. The drain-source path of transistor 256 is electrically coupled between SAN signal path 210 and signal path 278. The drain-source path of transistor 258 is electrically coupled between signal path 280 and SAP signal path 212. The drain-source path of transistor 260 is electrically coupled between SAP signal path 212 and signal path 278.

The gates of transistors 262 and 264 are electrically coupled to CSL0 signal path 45a. The drain-source path of transistor 262 is electrically coupled between signal path 280 and LDQt signal path 214. The drain-source path of transistor 264 is electrically coupled between signal path 278 and LDQc signal path 216. The gates of transistors 266 and 268 are electrically coupled to MUXr signal path 218. The drain-source path of transistor 266 is electrically coupled between signal path 280 and BLt0 signal path 36f. The drain-source path of transistor 268 is electrically coupled between signal path 278 and BLc0 signal path 36e.

The gates of transistors 270 and 272 are electrically coupled to EQLr signal path 220. One side of the drain-source path of transistor 270 is electrically coupled to BLt0 signal path 36f. One side of the drain-source path of transistor 272 is electrically coupled to BLc0 signal path 36e. The other side of the drain-source path of transistors 270 and 272 is electrically coupled to one side of the drain-source path of transistor 276 through signal path 274. The other side of the drain-source path of transistor 276 is electrically coupled VBLEQ signal path 202. The gate of transistor 276 is electrically coupled to CSL0 signal path 45a.

Leakage limiters 222 and 238 prevent the leakage of current between VBLEQ signal path 202, BLc0 signal path 36a, BLt0 signal path 36b, BLc0 signal path 36e, and BLt0 signal path 36f. In response to a logic high CSL0 signal on CSL0 signal path 45a, transistors 240 and 276 shut off to prevent leakage current. In response to a logic low CSL0 signal, transistors 240 and 276 turn on to provide the VBLEQ signal to array equalize devices 224 and 236. Array equalize devices 224 and 236 equalize the array in response to a logic high EQL1 signal or EQLr signal, respectively. In one embodiment, array equalize devices 224 and 236 include bit line to bit line equalize devices.

Multiplexer 226 passes the data on BLc0 signal path 36a and BLt0 signal path 36b, or the data on signal path 278 and signal path 280, in response to a logic high MUX1 signal on MUX1 signal path 206. In response to a logic low MUX1 signal on MUX1 signal path 206, multiplexer 226 blocks the data on BLc0 signal path 36a and BLt0 signal path 36b, or the data on signal path 278 and signal path 280. Multiplexer 236 passes the data on BLc0 signal path 36e and BLt0 signal path 36f, or the data on signal path 278 and signal path 280 in response to a logic high MUXr signal on MUXr signal path 218. In response to a logic low MUXr signal, multiplexer 236 blocks the data on BLc0 signal path 36e and BLt0 signal path 36f, or the data on signal path 278 and signal path 280.

Sense-amp equalize device 228 equalizes the voltage on signal paths 280 and 278 in response to a logic high EQLSA signal on EQLSA signal path 208. In response to a logic low EQLSA signal, sense-amp equalize device 228 shuts off. In one embodiment, sense-amp equalize device 228 includes bit line to VBLEQ equalize devices.

Cross-coupled amplifier latch 230 latches the data on or provides data to BLc0 signal path 36a and BLt0 signal path 36b or BLc0 signal path 36e and BLt0 signal path 36f. Bit line to data line switch 232 passes data between cross-coupled amplifier latch 230 and LDQt signal path 214 and LDQc signal path 216 in response to a logic high CSL0 signal on CSL0 signal path 45a. In response to a logic low CSL0 signal, bit line to data line switch 232 shuts off to prevent the passing of data between cross-coupled amplifier latch 230 and LDQt signal path 214 and LDQc signal path 216.

Figure 5:
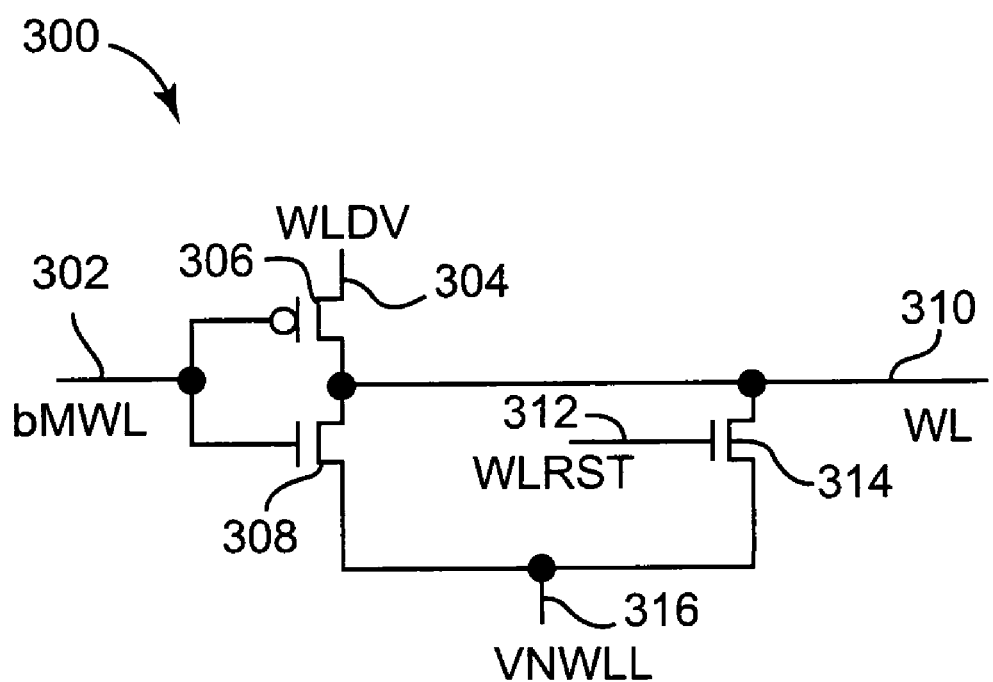
FIG. 5 is a diagram illustrating one embodiment of a word line driver circuit.

FIG. 5 is a diagram illustrating one embodiment of a local word line driver 300. In one embodiment, array block left side 32a and array block right side 32b each include one local word line driver 300 for each word line in array block left side 32a and array block right side 32b. Word line driver 300 includes transistors 306, 308, and 314. In one embodiment, transistor 306 is a p-channel field effect transistor, and transistors 308 and 314 are n-channel field effect transistors. The gates of transistors 306 and 308 receive the bMWL signal on bMWL signal path 302. The drain-source path of transistor 306 is electrically coupled between word line driver voltage (WLDV) signal path 304 and word line (WL) signal path 310. The drain-source path of transistor 308 is electrically coupled between WL signal path 310 and negative word line low voltage (VNWLL) signal path 316. The gate of transistor 314 receives the word line reset (WLRST) signal on WLRST signal path 312. The drain-source path of transistor 314 is electrically coupled between WL signal path 310 and VNWLL signal path 316.

In response to a logic low bMWL signal on bMWL signal path 302, transistor 306 turns on and transistor 308 turn off to drive the voltage on WL signal path 310 to WLDV. In response to a logic high bMWL signal, transistor 306 turns off and transistor 308 turns on to drive the voltage on WL signal path 310 to VNWLL. In response to a logic high WLRST signal on WLRST signal path 312, transistor 314 turns on to drive the voltage on WL signal path 310 to VNWLL. In response to a logic low WLRST signal, transistor 314 turns off. In operation, a word line control circuit, such as word line control left side circuit 40a and word line control right side circuit 40b, controls the bMWL, WLDV, and WLRST signals to activate or deactivate word lines within memory array 32 for reading data from or writing data to memory array 32.

Figure 6:
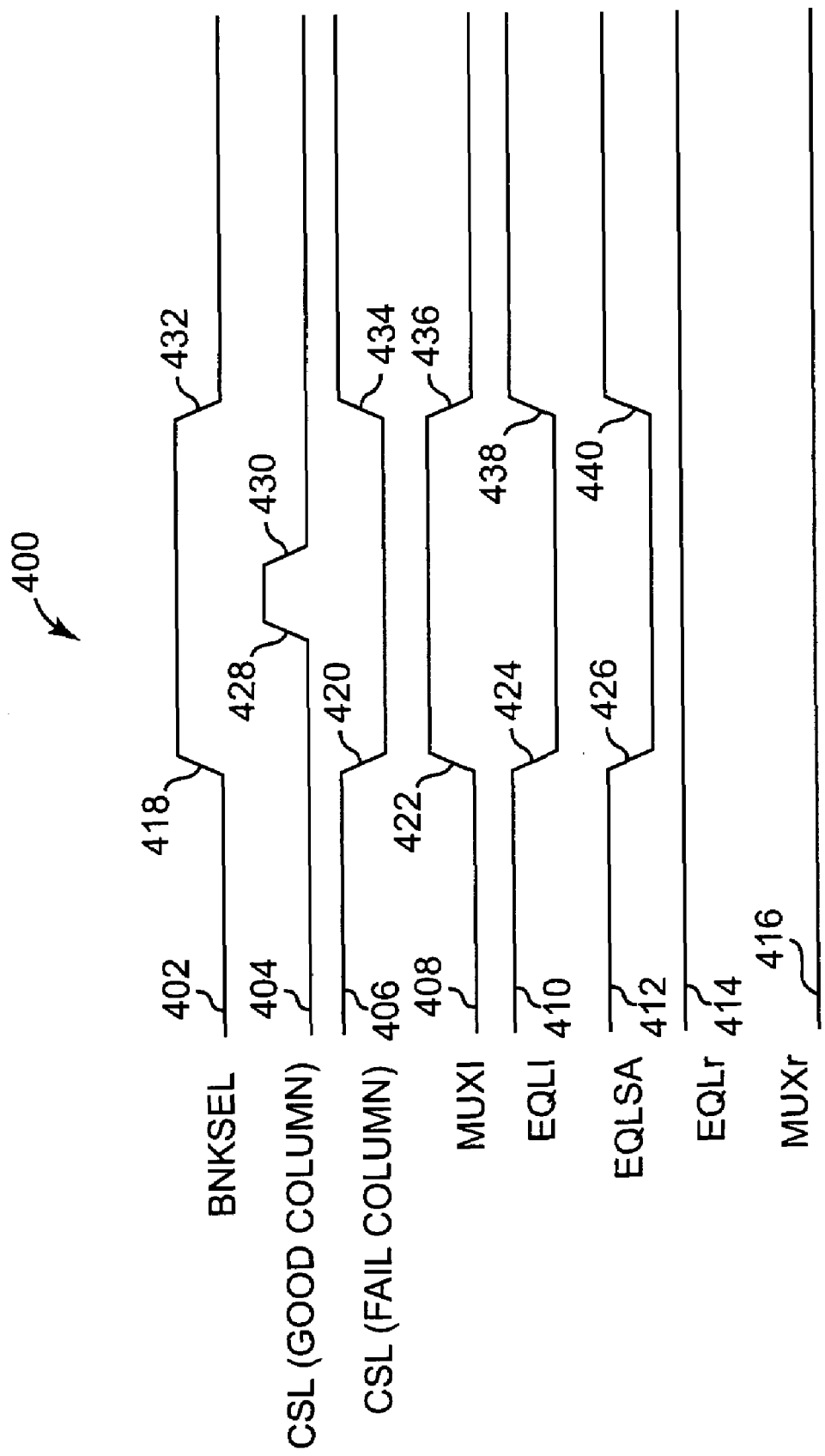
FIG. 6 is a timing diagram illustrating the timing of signals for a sense amplifier control circuit and a column select line control circuit.

FIG. 6 is a timing diagram 400 illustrating one embodiment of the timing of signals generated by sense amplifier control circuit 42b and CSL control circuit 44a. Timing diagram 400 includes BNKSEL signal 402 on BNKSEL signal path 112, CSL (good column) signal 404 on a CSL signal path 45 for a good column, CSL (fail column) signal 406 on a CSL signal path 45 for a fail column, MUX1 signal 408 on MUX1 signal path 206, EQL1 signal 410 on EQL1 signal path 204, EQLSA signal 412 on EQLSA signal path 208, EQLr signal 414 on EQLr signal path 220, and MUXr signal 416 on MUXr signal path 218. Timing diagram 400 illustrates the timing of signals with memory array block left side 32a active. A similar complementary timing diagram applies to the timing of signals with memory array block right side 32b active.

With array block left side 32a active, EQLr signal 414 remains logic high and MUXr signal 416 remains logic low during the standby and active states. In response to rising edge 418 of BNKSEL signal 402, CSL (fail column) signal 406 transitions from logic high to logic low at 420, MUX1 signal 408 transitions from logic low to logic high at 422, EQL1 signal 410 transitions from logic high to logic low at 424, and EQLSA signal 412 transitions from logic high to logic low at 426. With BNKSEL signal 402 logic high, CSL (good column) signal 404 transitions from logic low to logic high at 428 and from logic high to logic low at 430 to read data from or write data to memory array 32. In response to falling edge 432 of BNKSEL signal 402, CSL (fail column) signal 406 transitions to logic high at 434, MUX1 signal 408 transitions to logic low at 436, EQLI signal 410 transitions to logic high at 438, and EQLSA signal 412 transitions to logic high at 440.

Figure 7:
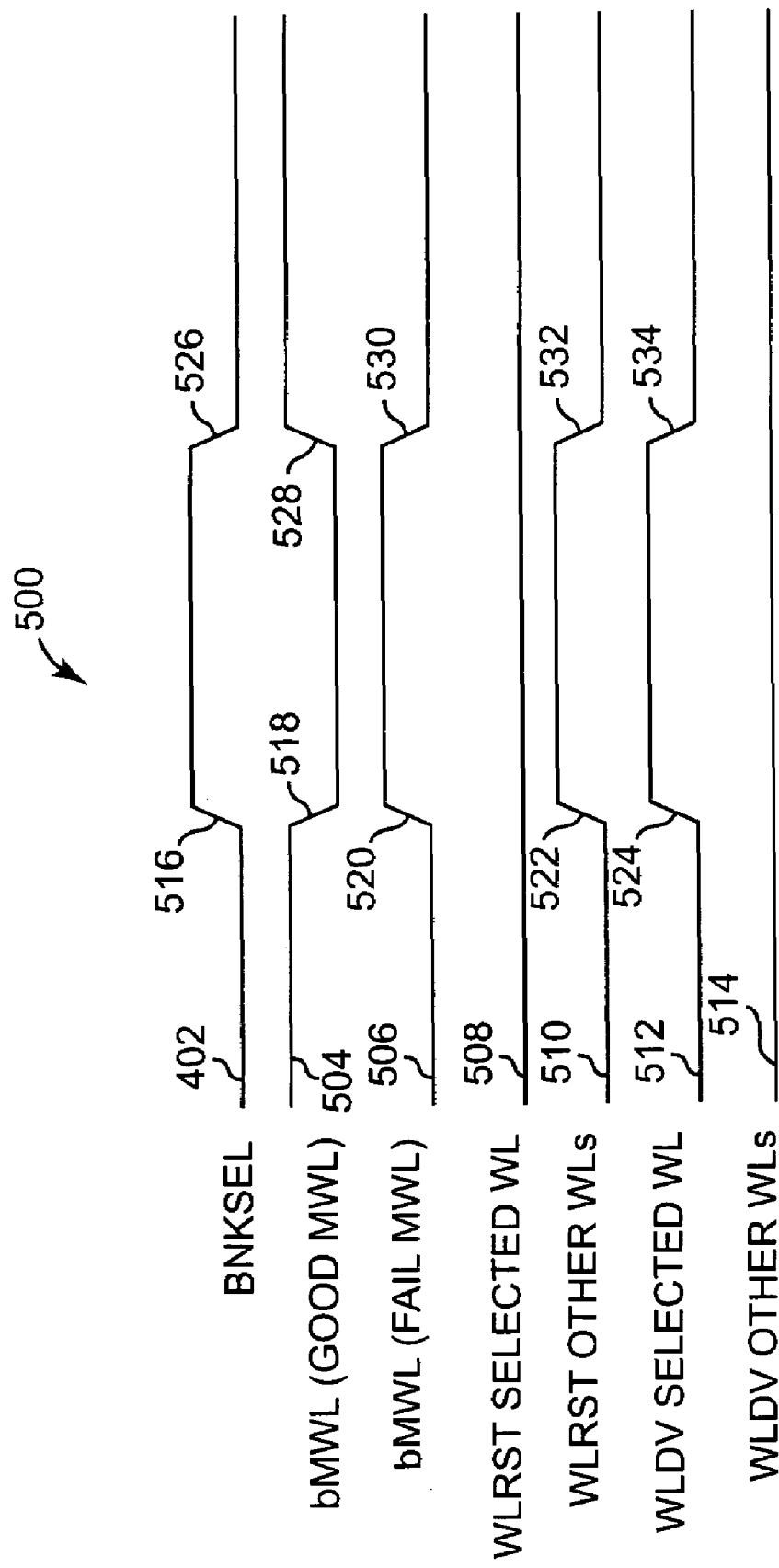
FIG. 7 is a timing diagram illustrating one embodiment of the timing of signals for a word line control circuit.

FIG. 7 is a timing diagram 500 illustrating one embodiment of the timing of signals for word line control left side circuit 40a and word line control right side circuit 40b. Timing diagram 500 includes BNKSEL signal 402 on BNKSEL signal path 112, bMWL (good MWL) signal 504 on bMWL signal path 302 for a good MWL, bMWL (fail MWL) signal 506 on bMWL signal path 302 for a fail MWL, WLRST selected WL signal 508 on WLRST signal path 312 for a selected word line, WLRST other WLs signal 510 on WLRST signal path 312 for a non-selected word line, WLDV selected WL signal 512 on WLDV signal path 304 for the selected word line, and WLDV other WLs signal 514 on WLDV signal path 304 for a non-selected word line.

WLDV other WLs signal 514 and WLRST select WL signal 508 remain logic low in both the standby and active states. In response to rising edge 516 of BNKSEL signal 402, bMWL (good MWL) signal 504 transitions from logic high to logic low at 518, bMWL (fail MWL) signal 506 transitions from logic low to logic high at 520, WLRST other WLs signal 510 transitions from logic low to logic high at 522, and WLDV selected WL signal 512 transitions from logic low to logic high at 524. In response to falling edge 526 of BNKSEL signal 402, bMWL (good MWL) signal 504 transitions to logic high at 528, bMWL (fail MWL) transitions to logic low at 530, WLRST other WLs signal 510 transitions to logic low at 532, and WLDV selected WL signal 512 transitions to logic low at 534.

Figure 8:
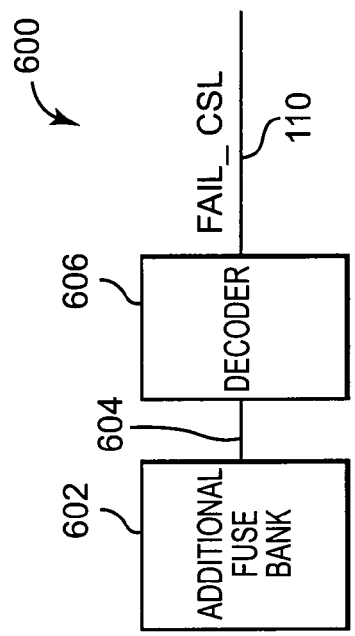
FIG. 8 is a block diagram illustrating one embodiment of generating fail column select line addresses.

FIG. 8 is a block diagram illustrating one embodiment of a circuit 600 for generating the fail CSL addresses. Circuit 600 includes additional fuse bank 602 and decoder 606. Additional fuse bank 602 is electrically coupled to decoder 606 through communication link 604. Additional fuse bank 602 is in addition to the typical column redundancy fuse bank and provides the redundancy information for fail CSL addresses. Decoder 606 decodes the state of fuses in additional fuse bank 602 to output the fail CSL addresses on FAIL_CSL signal path 110.

Figure 9:
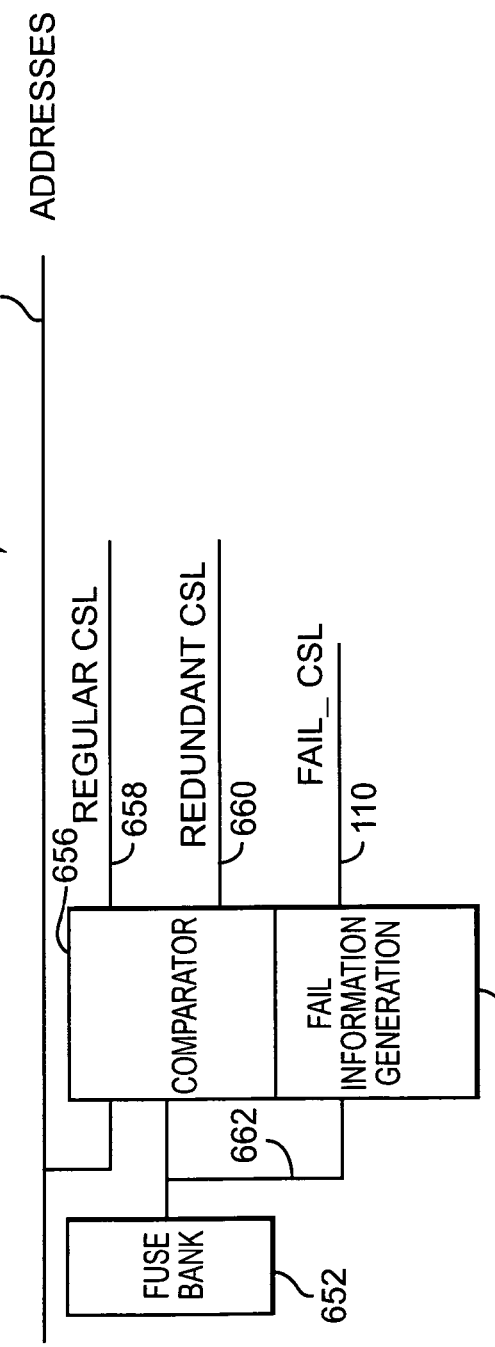
FIG. 9 is a block diagram illustrating another embodiment for generating fail column select line addresses.

FIG. 9 is a block diagram illustrating another embodiment for generating fail CSL addresses. Circuit 650 includes redundancy fuse bank 652, comparator 656, and fail information generation circuit 664. Redundancy fuse bank 652 is electrically coupled to comparator 656 and fail information generation circuit 664 through communication link 662. Comparator 656 receives column addresses on addresses signal path 654 and compares the column addresses to column address information from redundancy fuse bank 652. If a column address from addresses signal path 654 matches information provided by redundancy fuse bank 652 (redundancy hit), comparator 656 activates the redundant CSL on signal path 660 instead of the regular CSL on signal path 658. At the same time, fail information generation circuit 664 generates fail CSL addresses on FAIL_CSL signal path 110 from the redundancy information provided by redundancy fuse bank 652.

Figure 10:
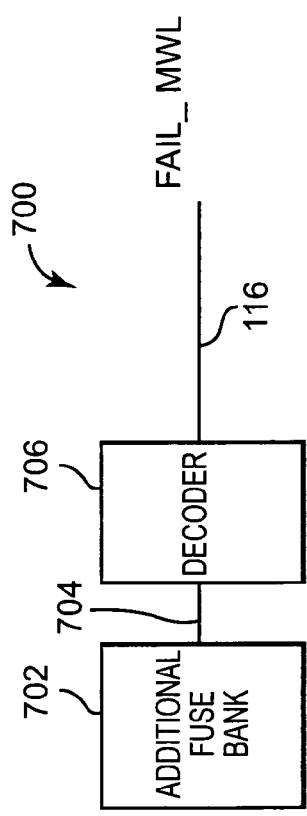
FIG. 10 is a block diagram illustrating one embodiment of generating fail master word line addresses.

FIG. 10 is a block diagram illustrating one embodiment of a circuit 700 for generating the fail MWL addresses. Circuit 700 includes additional fuse bank 702 and decoder 706. Additional fuse bank 702 is electrically coupled to decoder 706 through communication link 704. Additional fuse bank 702 is in addition to the typical redundancy fuse bank and provides the redundancy information for fail MWL addresses. Decoder 706 decodes the state of fuses in additional fuse bank 702 to output fail MWL addresses on FAIL_MWL signal path 116.

Figure 11:
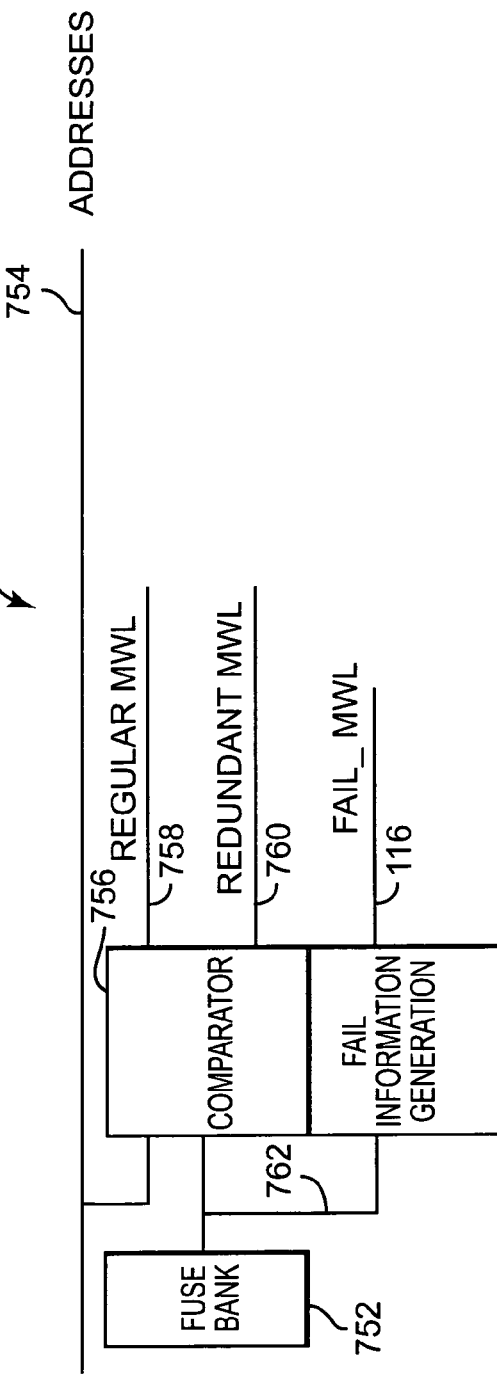
FIG. 11 is a block diagram illustrating another embodiment for generating fail master word line addresses.

FIG. 11 is a block diagram illustrating another embodiment for generating the fail MWL addresses. Circuit 750 includes redundancy fuse bank 752, comparator 756, and fail information generation circuit 764. Redundancy fuse bank 752 is electrically coupled to comparator 756 and fail information generation circuit 764 through communication link 762. Comparator 756 receives row addresses on addresses signal path 754 and compares the row addresses information from redundancy fuse bank 752. If a row address from addresses signal path 754 matches information provided by redundancy fuse bank 752 (redundancy hit), comparator 756 activates the redundant MWL on signal path 760 instead of the regular MWL on signal path 758. At the same time, fail information generation circuit 764 generates fail MWL addresses on FAIL_MWL signal path 116 from the redundancy information provided by redundancy fuse bank 752.

FIG. 12 is a table 800 illustrating one embodiment of the possible values for signals indicated in column 802 during the precharge state indicated in column 804, the active state indicated in column 806, and the read/write state indicated in column 808 for DRAM 10. Table 800 includes the possible values for signals for DRAM 10 depending on whether a column in memory array 32 is good or bad (fail) and the location of the column (active or inactive side) in the array.

Embodiments of the present invention provide an equalize scheme to eliminate leakage current due to bit line shorts in midlevel sense amplifiers. DRAM 10 switches off equalization individually for bit lines that have memory array shorts while not affecting equalization of other bit lines. In addition, the embodiments of the invention are implemented with minimal increased circuit area.

What is claimed is:

1. A sense amplifier for a memory comprising:
   a transistor configured to be switched with a column select line to pass a bit line equalization voltage;
   an array equalize device coupled to the transistor for receiving the bit line equalization voltage;
   a sense amplifier equalize device;
   a multiplexer coupled between the sense amplifier equalize device and the array equalize device; and
   a cross-coupled amplifier latch coupled to the sense amplifier equalize device.

2. The sense amplifier of claim 1, wherein the transistor comprises a p-channel field effect transistor.

3. The sense amplifier of claim 1, wherein the sense amplifier equalize device is configured to be controlled based on a logical AND of a left array equalize device control signal and a right array equalize device control signal.

4. The sense amplifier of claim 1, wherein the sense amplifier equalize. device comprises a bit line true to bit line complement equalize device.

5. The sense amplifier of claim 1, wherein the sense amplifier equalize device comprises a bit line to bit line equalization voltage equalize device.

6. The sense amplifier of claim 1, wherein the sense amplifier equalize device comprises a bit line true to bit line complement equalize device and a bit line to bit line equalization voltage equalize device.

7. The sense amplifier of claim 1, wherein the array equalize device comprises a bit line true to bit line complement equalize device.

8. The sense amplifier of claim 1, wherein the array equalize device comprises a bit line to bit line equalization voltage equalize device.

9. The sense amplifier of claim 1, wherein the array equalize device comprises a bit line true to bit line complement equalize device and a bit line to bit line equalization voltage equalize device.

10. The sense amplifier of claim 1, wherein the multiplexer is configured to be shut down during a standby state to isolate the cross-coupled amplifier latch from a memory array.

11. A sense amplifier for a memory comprising:
   means for limiting a leakage current in a sense amplifier, the means for limiting controlled by a column select line;
   means for equalizing a memory array voltage, the means for equalizing the memory array voltage coupled to the means for limiting;
   means for equalizing a sense amplifier voltage;
   means for isolating the means for equalizing the memory array voltage from the means for equalizing the sense amplifier voltage; and
   means for sensing a memory cell voltage, the means for sensing coupled to the means for equalizing the sense amplifier voltage.

12. A method for operating a memory, the method comprising:
   switching off a bit line equalization voltage to a first array equalize device for a first sense amplifier for a fail column during a standby state;
   switching on the bit line equalization voltage to a second array equalize device for a second sense amplifier for a good column during the standby state; and
   switching on the bit line equalization voltage to the first array equalize device for the fail column during an active state.

13. The method of claim 12, further comprising:
   enabling the first array equalize device during the standby state;
   enabling a sense amplifier equalize device during the standby state;
   disabling the first array equalize device during the active state; and
   disabling the sense amplifier equalize device during the active state.

14. The method of claim 13, further comprising:
   disabling a multiplexer coupled between the first array equalize device and the sense amplifier equalize device during the standby state; and
   enabling the multiplexer during the active state.

15. The method of claim 12, further comprising:
   driving a word line for a fail master word line to a logic low word line driver voltage during the standby state; and
   driving the word line for the fail master word line to a negative word line low voltage during the active state.

* * * * *